United States Patent [19]

Gilchrist

[11] Patent Number: 5,877,063

[45] Date of Patent: Mar. 2, 1999

[54] METHOD OF FORMING ROUGH POLYSILICON SURFACES

[75] Inventor: Robin Lee Gilchrist, Boise, Id.

[73] Assignee: Micron Technology, Inc., Boise, Id.

[21] Appl. No.: 502,906

[22] Filed: Jul. 17, 1995

[51] Int. Cl.$^6$ .................................................. H01L 21/20
[52] U.S. Cl. ........................ 438/398; 438/225; 438/649; 438/647; 148/DIG. 138
[58] Field of Search ................................ 437/47, 52, 60, 437/919, 193, 200; 148/DIG. 138; 438/398, 396, 253, 255, 649, 648, 655, 656, 647

[56] References Cited

U.S. PATENT DOCUMENTS

| | | | |
|---|---|---|---|
| 5,110,572 | 5/1992 | Lu .............................................. | 437/47 |
| 5,474,949 | 12/1995 | Hirao et al. .............................. | 437/919 |
| 5,543,347 | 8/1996 | Kawano et al. .......................... | 437/60 |

*Primary Examiner*—Tuan H. Nguyen
*Attorney, Agent, or Firm*—Wells, St. John, Roberts, Gregory & Matkin, P.S.

[57] ABSTRACT

A semiconductor processing method of providing a polysilicon film having induced outer surface roughness includes, a) providing a polysilicon layer over a substrate, the polysilicon layer having an outer surface of a first degree of roughness; b) providing a layer of a refractory metal silicide over the outer surface of the polysilicon layer, the refractory metal silicide preferably being $WSi_x$ where "x" is initially from 1.0 to 2.5, the $WSi_x$ layer and the polysilicon layer outer surface defining a first interface therebetween; c) annealing the substrate at a temperature and for a time period which are effective to transform the $WSi_x$ into a tetragonal crystalline structure and to transform the first interface into a different second interface, the $WSi_x$ layer not being in a tetragonal crystalline state prior to the anneal, the $WSi_x$ at the second interface having an increased value of "x" from the initial value of "x"; and d) etching the $WSi_x$ layer from the polysilicon layer at least to the second interface to leave an outer polysilicon surface having a second degree of roughness, the second degree of roughness being greater than the first degree of roughness. A capacitor having a conductive plate comprising a polysilicon film produced by the process is also disclosed.

34 Claims, 3 Drawing Sheets

METHOD OF FORMING ROUGH POLYSILICON SURFACES

TECHNICAL FIELD

This invention relates generally to semiconductor processing methods of providing a roughened polysilicon film and to capacitor constructions incorporating roughened polysilicon films.

BACKGROUND OF THE INVENTION

The reduction in memory cell size required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the cell area. These include structures utilizing trench and stacked capacitors, as well as the utilization of new capacitor dielectric materials having higher dielectric constants.

One common material utilized for the capacitor plates is conductively doped polysilicon. Such material is so utilized because of its compatibility with subsequent high temperature processing, good thermal expansion properties with $SiO_2$, and its ability to be conformally deposited over widely varying typography.

As background, silicon occurs in crystalline and amorphous forms. Further, there are two basic types of crystalline silicon known as monocrystalline silicon and polycrystalline silicon. Polycrystalline silicon, polysilicon for short, is typically in situ or subsequently conductively doped to render the material conductive. Monocrystalline silicon is typically epitaxially grown from a silicon substrate. Silicon films deposited on dielectrics (such as $SiO_2$ and $Si_3N_4$) result in either an amorphous or polycrystalline phase. Specifically, it is generally known within the prior art that silicon deposited at wafer temperatures of less than approximately 580° C. will result in an amorphous silicon layer, whereas silicon deposited at temperatures higher than about 580° C. will result in a polycrystalline layer. The specific transition temperature depends on the source chemicals/precursors used for the deposition.

The prior art has recognized that capacitance of a polysilicon layer can be increased merely by increasing the surface roughness of the polysilicon film that is used as a capacitor storage node. Such roughness is typically transferred to the cell dielectric and overlying polysilicon layer interfaces, resulting in a larger surface area for the same planar area which is available for the capacitor. One procedure utilized to achieve surface roughening involves deposition under conditions which are intended to inherently induce a rough or rugged upper polysilicon surface. Such include low pressure chemical vapor deposition (LPCVD) techniques. Yet, such techniques are inherently unpredictable or inconsistent in the production of a rugged polysilicon film.

One type of polysilicon film which maximizes outer surface area is hemispherical grain polysilicon. Such can be deposited or grown by a number of techniques. One technique includes direct LPCVD formation at 590° C. Another includes formation by first depositing an amorphous silicon film at 550° C. using He diluted $SiH_4$ (20%) gas at 1.0 Torr, followed by a subsequent high temperature transformation anneal. Hemispherical grain (HSG) polysilicon is typically not, however, in situ doped during its deposition due to undesired reduction in grain size in the resultant film. Accordingly, alternate techniques are utilized to conductively dope the hemispherical grain polysilicon after its deposition. To provide such doping, an underlayer of doped polysilicon can be provided, with subsequent doping of the HSG polysilicon layer occurring by an annealing step to drive the dopant outwardly. Alternately, dopant can be implanted into the polysilicon after its deposition from above, although such can have a tendency to smoothen the deposited HSG layer.

One example method for providing doped HSG poly is as follows. A doped layer of amorphous or polycrystalline silicon is provided atop substrate wafers by chemical vapor deposition within a suitable reactor. The wafers are removed from the reactor in ambient air which results in oxidation to produce a native oxide layer typically of 20 Angstroms or greater. During such fabrication, various wafers may remain in ambient air conditions for varying time periods of several hours to a few days prior to subsequent processing for forming an HSG polysilicon layer. To accommodate such varying thickness native oxide layers, the wafers are collectively cleaned in multiple HF dipping steps to remove the native oxide back to an exposed silicon layer. Then within two hours of the final strip, the wafers are provided within a chemical vapor deposition reactor.

With all wafers being processed having the common two hour or less exposure, each will have a substantially uniform thickness native oxide layer of 20 Angstroms. This native oxide layer is a requirement for formation of HSG polysilicon. Within the chemical vapor deposition reactor, the respective wafers are subjected to conditions suitable for formation of a continuous HSG polysilicon layer. At this point, the HSG layer is undoped and is subsequently subjected to suitable conditions in an effort to drive conductivity enhancing dopant ions from the underlying silicon layer through the native oxide layer and into the HSG layer. Such does not, however, typically provide a desired uniform and high dopant concentration within the HSG layer as would otherwise be provided were in sitlu HSG doping practical.

Needs remain for providing improved methods of producing roughened conductively doped polysilicon films for utilization in improved capacitor constructions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of providing a polysilicon film having induced outer surface roughness comprises the following steps:

providing a polysilicon layer over a substrate, the polysilicon layer having an outer surface of a first degree of roughness;

providing a layer of a metal silicide over the outer surface of the polysilicon layer, the metal silicide layer and the polysilicon layer outer surface defining a first interface therebetween;

annealing the substrate at a temperature and for a time period which are effective to transform the first interface into a different second interface; and etching the metal silicide layer from the polysilicon layer at least to the second interface to leave an outer polysilicon surface having a second degree of roughness, the second degree of roughness being greater than the first degree of roughness.

In accordance with other aspects of the invention, a semiconductor processing method of providing a polysilicon film having induced outer surface roughness comprises the following steps:

providing a polysilicon layer over a substrate, the polysilicon layer having an outer surface of a first degree of roughness;

providing a layer of $WSi_x$ over the outer surface of the polysilicon layer, where "x" is initially from 1.0 to 2.5, the $WSi_x$ layer and the polysilicon layer outer surface defining a first interface therebetween;

annealing the substrate at a temperature and for a time period which are effective to transform the $WSi_x$ into a tetragonal crystalline structure and to transform the first interface into a different second interface, the $WSi_x$ layer not being in a tetragonal crystalline state prior to the anneal, the $WSi_x$ at the second interface having an increased value of "x" from the initial value of "x"; and etching the $WSi_x$ layer from the polysilicon layer at least to the second interface to leave an outer polysilicon surface having a second degree of roughness, the second degree of roughness being greater than the first degree of roughness.

Figure 1:
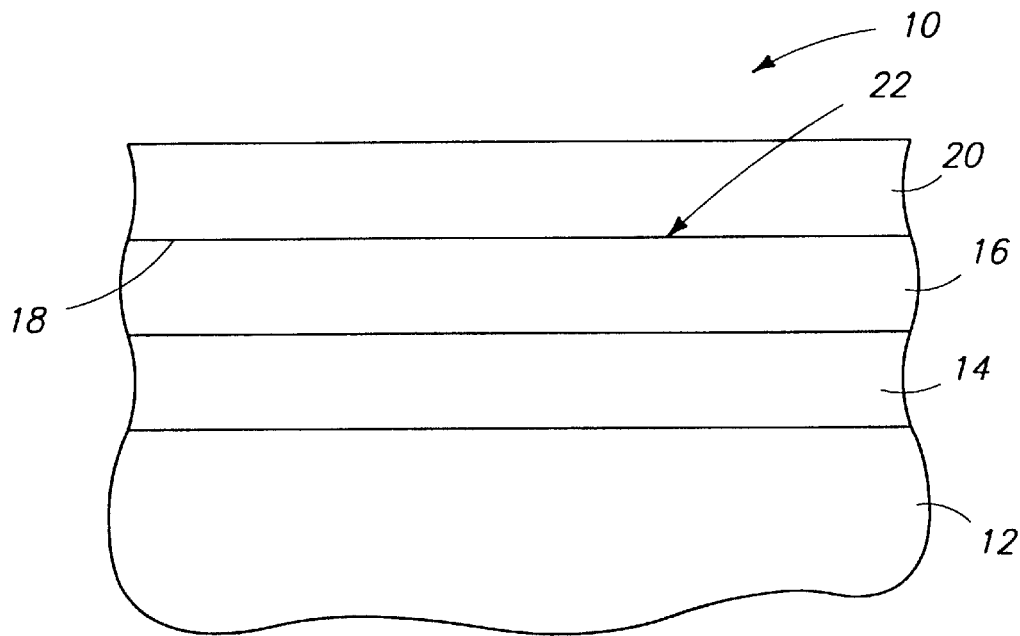
FIG. 1 is a diagrammatic sectional view of a semiconductor wafer fragment at one processing step in accordance with the invention.

More specifically and with reference to the figures, FIG. 1 shows a semiconductor wafer fragment indicated generally with reference numeral 10. Such is comprised of a bulk monocrystalline silicon substrate 12 having an insulating layer 14 of silicon dioxide provided thereatop. A layer 16 of polysilicon is provided over substrate 12/14. Preferably, polysilicon layer 16 is provided by chemical vapor deposition. It can be in situ conductively doped during the chemical vapor deposition process, or conductively doped after deposition. An example in situ doped CVD process for layer 16 is to provide silane and phosphine ($PH_3$) within a CVD reactor to provide layer 16 to an example thickness of 1500 Angstroms. Alternately, wafers provided with an undoped polysilicon layer can be subjected to a separate diffusion step which grows a phosphorus rich oxide on the polysilicon surface. This can be accomplished in a vertical furnace with atmospheric chemical vapor deposition at 907° C. using $PH_3$ and $O_2$. The phosphorus diffuses into the polysilicon from the oxide. The oxide is wet stripped, leaving phosphorus doped polysilicon. Regardless, for purposes of the continuing discussion, polysilicon layer 16 has an outer surface 18 of some first degree of roughness resulting from the deposition.

A layer 20 of a metal silicide is provided over outer surface 18 of polysilicon layer 16. Such accordingly defines a first interface 22 between layer 20 and layer 16, which includes outer surface 18 of layer 16. The preferred metal silicide is $WSi_x$. Other possible examples include $NiSi_x$, $TiSi_x$, $PtSi_x$, and $CoSi_x$. An example process for providing layer 20 as $WSi_x$ is by chemical vapor deposition, such as using $WF_6$ and $SiH_4$ gases at 400° C. and 800 mTorr. Under such conditions, the $WSi_x$ layer as-deposited will be amorphous. An example thickness for layer 20 is 1200 Angstroms. As deposited, "x" will typically initially range anywhere from 1.0 to 2.5.

Figure 2:
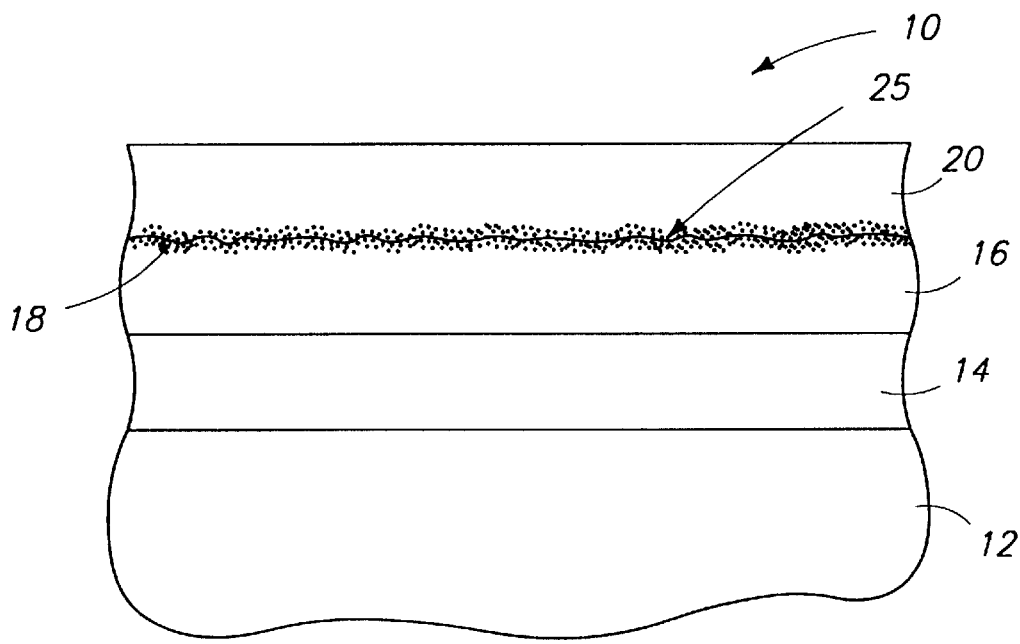
FIG. 2 is a view of the FIG. 1 wafer fragment at a processing step subsequent to that shown by FIG. 1.

Referring to FIG. 2, substrate/wafer 10 is annealed at a temperature and for a time period which are effective to transform first interface 22 into a different second interface 25. An example temperature range for the annealing step is from 300° C. to 1100° C. in a horizontal furnace, with a treatment time ranging anywhere from 10 minutes to 12 hours. Pressure is preferably atmospheric. In accordance with the preferred aspect of the invention, the amorphous $WSi_x$ during such treatment is first transformed to a hexagonal crystalline $WSi_x$ material, and subsequently to a resultant tetragonal crystalline $WSi_x$ material. In going from an amorphous state to ultimately a tetragonal crystalline state, excess silicon atoms from polysilicon layer 16 segregate or migrate to interface 22, which effectively increases the value of "x" of metal silicide layer 20 at the interface to a greater value than the "x" as initially deposited. For example, if the initial as-deposited value of "x" was predominantly or on average 2.2, a resultant value for "x" after the described effective anneal may be 2.5 or higher. Accordingly, second interface 25 takes on a different characteristic than interface 22, with the result typically being at this point in the process a more rugged and less linear defined interface.

Figure 3:
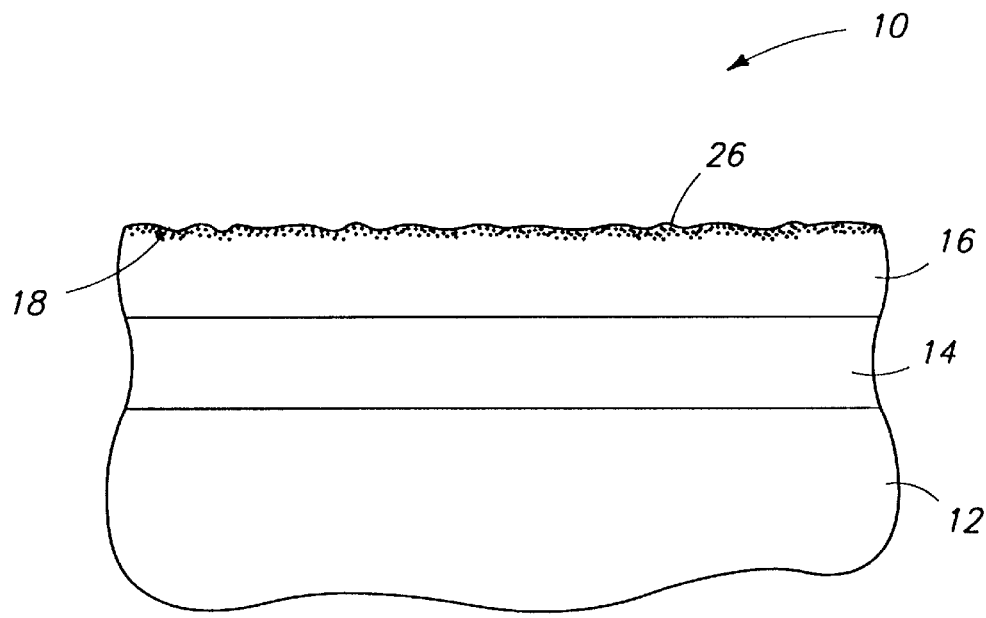
FIG. 3 is a view of the FIG. 1 wafer fragment at a processing step subsequent to that shown by FIG. 2.

Referring to FIG. 3, $WSi_x$ layer 20 is etched from atop polysilicon layer 16 at least inwardly to the second interface 25 to substantially remove all of $WSi_x$ material from layer 20 to leave an outer polysilicon surface 26 which has a second degree of roughness. The second degree of roughness will be greater than the first degree of roughness of outer surface 22 of FIG. 1. The regions of excess silicon, the result of the increased value of "x", result in the formation of discrete areas in the vicinity of interface 25 which have different etch selectivities in the etch of the metal silicide substantially selectively relative to the polysilicon of layer 16. When the $WSi_x$ film is etched away using dry/plasma technology, these areas with different etch selectivities leave behind a considerably rougher or texturized polysilicon surface 26, thus resulting in significantly enhanced roughness. An example dry etch for removing the $WSi_x$ layer includes using $SF_6$ as a source gas. Other fluorine or other gases can of course be utilized, such as $NF_3$, $CF_4$, $C_2F_6$, etc. A specific etch example would be at a pressure of 20 mTorr, 30° C., $NF_3$ flow at 30 sccm and $HeO_2$ flow at 6 sccm for 60 seconds, to etch a 1200 Angstrom thick $WSi_x$ layer.

Figure 4:
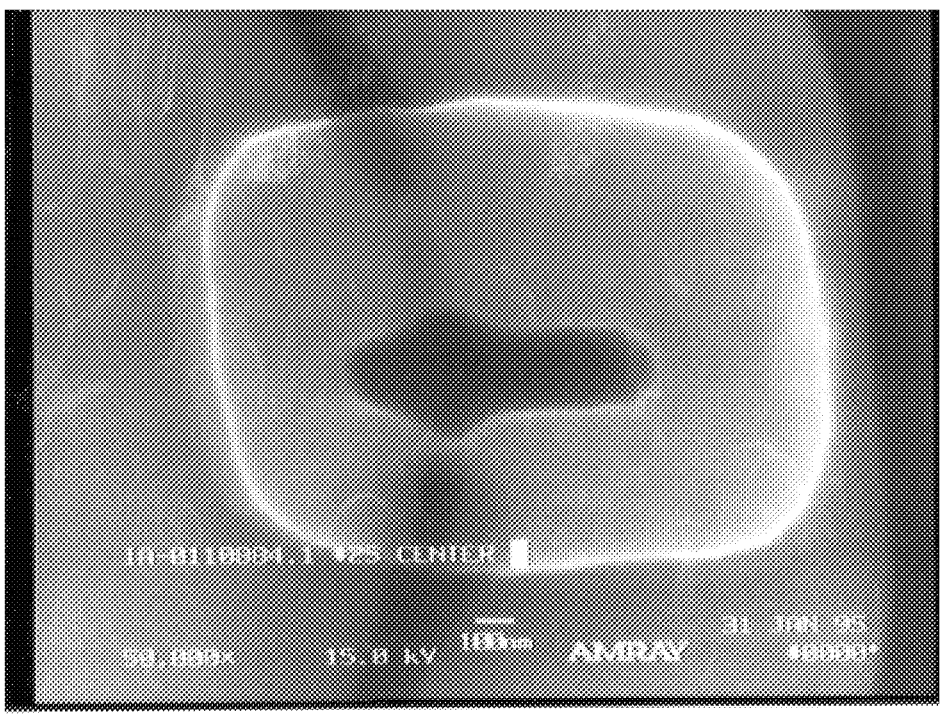
FIG. 4 is a scanning electron micrograph of an outer polysilicon surface not treated in accordance with the invention.
Figure 5:
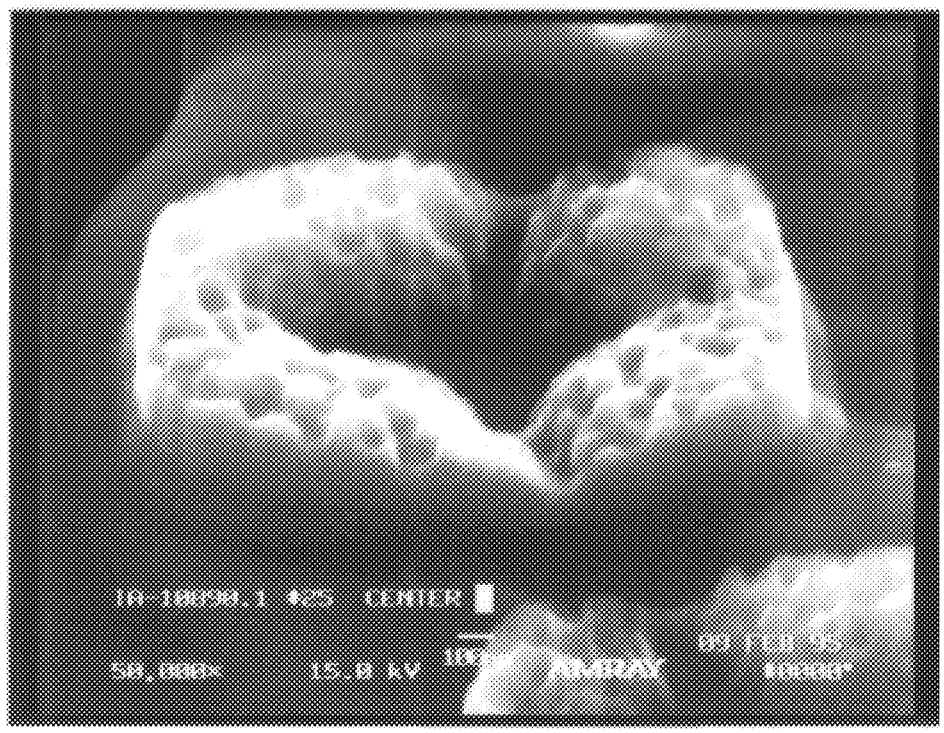
FIG. 5 is a scanning electron micrograph of an outer polysilicon surface treated in accordance with the invention.

A reduction to practice example and a control example can be compared by viewing the scanning electron micrographs constituting FIGS. 4 and 5. FIG. 4 illustrates a top or outer view of an upper polysilicon surface of a container-like polysilicon layer. Such was deposited by chemical vapor deposition, and was subsequently doped by phosphorus enriched oxide as described above. A layer of $WSi_x$ was subsequently deposited, and then dry etched using the above $NF_3$ example, but with no intervening annealing process in accordance with the invention.

FIG. 5, on the other hand, illustrates a same container construction of a polysilicon layer which was provided and patterned identically to the FIG. 4 construction, but did include a high temperature anneal at 957° C. for 30 minutes, at 760 Torr. The WSi$_x$ layer was subsequently dry plasma etched using the above NF$_3$ example, just as in the FIG. 4 construction. The artisan will appreciate the striking comparison in outer surface roughness apparent from FIGS. 4 and 5.

Figure 6:
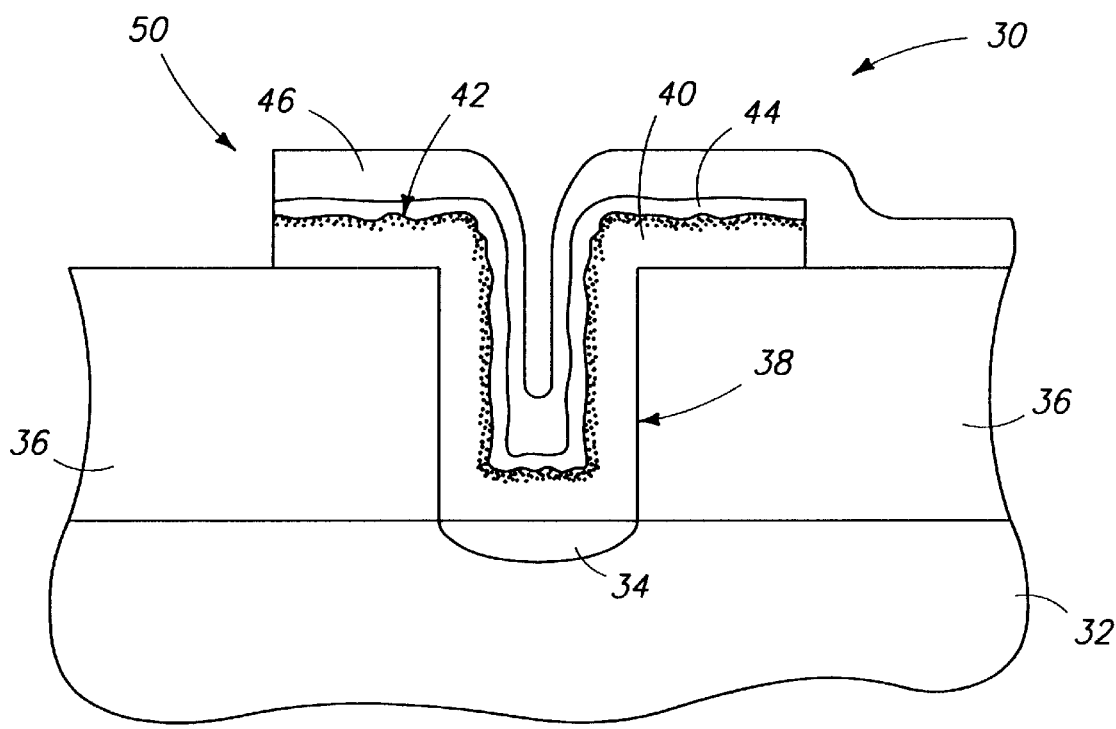
FIG. 6 is a diagrammatic sectional view of an alternate semiconductor wafer fragment in accordance with the invention.

The above described process is advantageously used in the production of a capacitor having a conductive plate comprising a polysilicon process produced by the above process. An example is depicted in FIG. 6. There illustrated is a wafer fragment 30 comprised of a bulk monocrystalline silicon bulk substrate 32. A diffusion region 34 is provided as shown within bulk substrate 32. A layer 36 of SiO$_2$ is deposited atop bulk substrate 32 and provided with a wide contact opening 38 therethrough to outwardly expose diffusion region or node 34.

A layer 40 of conductively doped polysilicon is provided in accordance with the above described process, and patterned as shown to produce a storage node plate having an outer roughened surface 42. A capacitor dielectric layer 44, such as ONO, is then provided outwardly over storage node layer 40. A subsequently provided cell polysilicon layer 46 is provided outwardly of capacitor dielectric layer 44, resulting in the depicted capacitor construction 50. Overall capacitance of the construction is increased by the enhanced roughness produced by the above described process.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method of providing a polysilicon film having induced outer surface roughness comprising the following steps:

providing a polysilicon layer over a substrate, the polysilicon layer having an outer surface of a first degree of roughness;

providing a layer of a metal silicide over the outer surface of the polysilicon layer, the metal silicide layer and the polysilicon layer outer surface defining a first interface therebetween;

annealing the substrate at a temperature and for a time period which are effective to transform the first interface into a different second interface; and etching the metal silicide layer from the polysilicon layer at least to the second interface to leave an outer polysilicon surface having a second degree of roughness, the second degree of roughness being greater than the first degree of roughness.

2. The semiconductor processing method of providing a polysilicon film of claim 1 wherein the metal silicide layer as deposited is amorphous.

3. The semiconductor processing method of providing a polysilicon film of claim 1 wherein the polysilicon layer is provided by a chemical vapor deposition process and is conductively doped prior to the annealing step.

4. The semiconductor processing method of providing a polysilicon film of claim 1 wherein the annealing temperature is from 300° C. to 1100° C.

5. The semiconductor processing method of providing a polysilicon film of claim 1 wherein the metal silicide layer as deposited is amorphous, and the polysilicon layer is provided by a chemical vapor deposition process and is conductively doped prior to the annealing step.

6. The semiconductor processing method of providing a polysilicon film of claim 1 wherein the metal silicide layer as deposited is amorphous, and the annealing temperature is from 300° C. to 11000° C.

7. The semiconductor processing method of providing a polysilicon film of claim 1 wherein the polysilicon layer is provided by a chemical vapor deposition process and is conductively doped prior to the annealing step.

8. The semiconductor processing method of claim 1, wherein the etching of the metal silicide comprises dry etching said silicide.

9. The semiconductor processing method of claim 1, wherein the providing of the metal silicide layer comprises chemical vapor depositing the silicide layer over the polysilicon layer.

10. A semiconductor processing method of providing a polysilicon film having induced outer surface roughness comprising the following steps:

providing a polysilicon layer over a substrate, the polysilicon layer having an outer surface of a first degree of roughness;

providing a layer of WSi$_x$ over the outer surface of the polysilicon layer, the WSi$_x$ layer and the polysilicon layer outer surface defining a first interface therebetween;

annealing the substrate at a temperature and for a time period which are effective to transform the WSi$_x$ into a tetragonal crystalline structure and to transform the first interface into a different second interface, the WSi$_x$ layer not being in a tetragonal crystalline state prior to the anneal; and etching the WSi$_x$ layer from the polysilicon layer at least to the second interface to leave an outer polysilicon surface having a second degree of roughness, the second degree of roughness being greater than the first degree of roughness.

11. The semiconductor processing method of providing a polysilicon film of claim 10 wherein the layer of WSi$_x$ as deposited is amorphous, the annealing step first transforming the amorphous WSi$_x$ to hexagonal crystalline WSi$_x$ and ultimately to tetragonal crystalline WSi$_x$.

12. The semiconductor processing method of providing a polysilicon film of claim 10 wherein the annealing temperature is from 300° C. to 1100° C.

13. The semiconductor processing method of providing a polysilicon film of claim 10 wherein, the layer of WSi$_x$ as deposited is amorphous, the annealing step first transforming the amorphous WSi$_x$ to hexagonal crystalline WSi$_x$ and ultimately to tetragonal crystalline WSi$_x$; and the annealing temperature is from 300° C. to 1100° C.

14. The semiconductor processing method of providing a polysilicon film of claim 10 wherein, the layer of WSi$_x$ as deposited is amorphous, the annealing step first transforming the amorphous WSi$_x$ to hexagonal crystalline WSi$_x$ and ultimately to tetragonal crystalline WSi$_x$; and the polysilicon layer is provided by a chemical vapor deposition process and is conductively doped prior to the annealing step.

15. The semiconductor processing method of providing a polysilicon film of claim 10 wherein, the layer of WSi$_x$ as deposited is amorphous, the annealing step first transforming the amorphous WSi$_x$ to hexagonal crystalline $WSi_x$ and ultimately to tetragonal crystalline $WSi_x$;

the polysilicon layer is provided by a chemical vapor deposition process and is conductively doped prior to the annealing step; and the annealing temperature is from 300° C. to 1100° C.

16. The semiconductor processing method of claim 10, wherein the etching of the $WSi_x$ layer comprises dry etching said layer.

17. The semiconductor processing method of claim 10, wherein the providing of the $WSi_x$ layer comprises chemical vapor depositing the layer over the polysilicon layer.

18. A semiconductor processing method of providing a polysilicon film having induced outer surface roughness comprising the following steps:

provide a polysilicon layer over a substrate, the polysilicon layer having an outer surface of a first degree of roughness;

providing a layer of $WSi_x$ over the outer surface of the polysilicon layer, where "x" is initially from 1.0 to 2.5, the $WSi_x$ layer and the polysilicon layer outer surface defining a first interface therebetween;

annealing the substrate at a temperature and for a time period which are effective to transform the first interface into a different second interface, the $WSi_x$ at the second interface having an increased value of "x" from the initial value of "x"; and etching the $WSi_x$ layer from the polysilicon layer at least to the second interface to leave an outer polysilicon surface having a second degree of roughness, the second degree of roughness being greater than the first degree of roughness.

19. The semiconductor processing method of providing a polysilicon film of claim 18 wherein the layer of $WSi_x$ as deposited is amorphous.

20. The semiconductor processing method of providing a polysilicon film of claim 18 wherein the polysilicon layer is provided by a chemical vapor deposition process and is conductively.

21. The semiconductor processing method of providing a polysilicon film of claim 18 wherein the annealing temperature is from 300° C. to 1100° C.

22. The semiconductor processing method of providing a polysilicon film of claim 18 wherein the layer of $WSi_x$ as deposited is amorphous, and the polysilicon layer is provided by a chemical vapor deposition process and is conductively doped prior to the annealing step.

23. The semiconductor processing method of providing a polysilicon film of claim 18 wherein the layer of $WSi_x$ as deposited is amorphous, and the annealing temperature is from 300° C. to 1100° C.

24. The semiconductor processing method of claim 18, wherein the etching of the $WSi_x$ layer comprises dry etching said layer.

25. The semiconductor processing method of claim 18, wherein the providing of the $WSi_x$ layer comprises chemical vapor depositing the layer over the polysilicon layer.

26. A semiconductor processing method of providing a polysilicon film having induced outer surface roughness comprising the following steps:

providing a polysilicon layer over a substrate, the polysilicon layer having an outer surface of a first degree of roughness;

providing a layer of $WSi_x$ over the outer surface of the polysilicon layer, where "x" is initially from 1.0 to 2.5, the $WSi_x$ layer and the polysilicon layer outer surface defining a first interface therebetween;

annealing the substrate at a temperature and for a time period which are effective to transform the $WSi_x$ into a tetragonal crystalline structure and to transform the first interface into a different second interface, the $WSi_x$ layer not being in a tetragonal crystalline state prior to the anneal, the $WSi_x$ at the second interface having an increased value of "x" from the initial value of "x"; and etching the $WSi_x$ layer from the polysilicon layer at least to the second interface to leave an outer polysilicon surface having a second degree of roughness, the second degree of roughness being greater than the first degree of roughness.

27. The semiconductor processing method of providing a polysilicon film of claim 26 wherein the layer of $WSi_x$ as deposited is amorphous, the annealing step first transforming the amorphous $WSi_x$ to hexagonal crystalline $WSi_x$ and ultimately to tetragonal crystalline $WSi_x$.

28. The semiconductor processing method of providing a polysilicon film of claim 26 wherein the annealing temperature is from 300° C. to 1100° C.

29. The semiconductor processing method of providing a polysilicon film of claim 26 wherein the polysilicon layer is provided by a chemical vapor deposition process and is conductively doped prior to the annealing step.

30. The semiconductor processing method of providing a polysilicon film of claim 26 wherein, the layer of $WSi_x$ as deposited is amorphous, the annealing step first transforming the amorphous $WSi_x$ to hexagonal crystalline $WSi_x$ and ultimately to tetragonal crystalline $WSi_x$; and the annealing temperature is from 300° C. to 1100° C.

31. The semiconductor processing method of providing a polysilicon film of claim 26 wherein, the layer of $WSi_x$ as deposited is amorphous, the annealing step first transforming the amorphous $WSi_x$ to hexagonal crystalline $WSi_x$ and ultimately to tetragonal crystalline $WSi_x$; and the polysilicon layer is provided by a chemical vapor deposition process and is conductively doped prior to the annealing step.

32. The semiconductor processing method of providing a polysilicon film of claim 26 wherein, the layer of $WSi_x$ as deposited is amorphous, the annealing step first transforming the amorphous $WSi_x$ to hexagonal crystalline $WSi_x$ and ultimately to tetragonal crystalline $WSi_x$;

the polysilicon layer is provided by a chemical vapor deposition process and is conductively doped prior to the annealing step; and the annealing temperature is from 300° C. to 1100° C.

33. The semiconductor processing method of claim 26, wherein the etching of the $WSi_x$ layer comprises dry etching said layer.

34. The semiconductor processing method of claim 26, wherein the providing of the $WSi_x$ layer comprises chemical vapor depositing the layer over the polysilicon layer.

* * * * *

UNITED STATES PATENT AND TRADEMARK OFFICE
CERTIFICATE OF CORRECTION

PATENT NO. : 5,877,063
DATED : 03/02/99
INVENTOR(S) : Gilchrist

It is certified that error appears in the above-identified patent and that said Letters Patent is hereby corrected as shown below:

Column 2, line 39, after "were", delete "in sitlu" and replace with --in situ--

Signed and Sealed this

Third Day of August, 1999

Attest:

Q. TODD DICKINSON

Attesting Officer

Acting Commissioner of Patents and Trademarks